United States Patent
Song et al.

(10) Patent No.: US 11,588,483 B1
(45) Date of Patent: Feb. 21, 2023

(54) QUASI-RESONANT THYRISTOR CURRENT INTERRUPTER

(71) Applicant: ABB Schweiz AG, Baden (CH)

(72) Inventors: Xiaoqing Song, Apex, NC (US); Yu Du, Pleasanton, CA (US); Yuzhi Zhang, Apex, NC (US); Harshang Shah, Glen Allen, VA (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/580,399

(22) Filed: Jan. 20, 2022

(51) Int. Cl.
    *H03K 17/72*     (2006.01)
    *H03K 17/567*     (2006.01)

(52) U.S. Cl.
    CPC ........... *H03K 17/72* (2013.01); *H03K 17/567* (2013.01)

(58) Field of Classification Search
    CPC .............................. H03K 17/72; H03K 17/567
    USPC ......................................................... 327/582
    See application file for complete search history.

(56) References Cited

U.S. PATENT DOCUMENTS 7,589,438 B2     9/2009    Galm
8,508,890 B2 *   8/2013    Zheng .................... H01H 9/541
                                                                  361/13

FOREIGN PATENT DOCUMENTS

WO      2016003357 A1     1/2016

OTHER PUBLICATIONS

Yanxun Guo et al, "A Thyristor Full-Bridge-Based DC Circuit Breaker", IEEE Transactions on Power Electronics, vol. 35, No. 1, Jan. 2020, pp. 1111-1123.
Christoph Meyer et al, "Solid-State Circuit Breaker Based on Active Thyristor Topologies", IEEE Transactions on Power Electronics, vol. 21, No. 2, Mar. 2006, pp. 450-458.
Po-Tai Cheng et al, "Design of an Impulse Communication Bridge for the Solid-State Transfer Switch", IEEE Transactions on Industry Applications, vol. 44, No. 4, Jul./Aug. 2008, pp. 1249-1258.

* cited by examiner

*Primary Examiner* — Tomi Skibinski
(74) *Attorney, Agent, or Firm* — Armstrong Teasdale LLP

(57) ABSTRACT

In one aspect, a quasi-resonant turn-off circuit is provided. The quasi-resonant turn-off circuit is couplable in parallel with a pair of anti-parallel thyristors. The quasi-resonant turn-off circuit includes a resonant capacitor and an energy recovery circuit. The resonant capacitor is configured to supply a charge to the pair of anti-parallel thyristors to decrease a turn-off time of the pair of anti-parallel thyristors. The energy recovery circuit is configured to recharge the resonant capacitor using remnant energy left in parasitic inductances coupled to the quasi-resonant turn-off circuit after the pair of anti-parallel thyristors is off.

20 Claims, 16 Drawing Sheets

Period Between $t_1$ and $t_2$

Period Between $t_3$ and $t_4$

QUASI-RESONANT THYRISTOR CURRENT INTERRUPTER

BACKGROUND

The field of the disclosure generally relates to solid-state switches, and more particularly, to controlling turn-off in thyristors.

Thyristors (also referred to as Silicon Controlled Rectifiers (SCRs)) are power semiconductor devices that are widely used in power applications. Thyristors provide a high current capacity in a single package, provide low conduction power loss, have a proven reliability, and are widely available at a low cost. However, one major disadvantage of thyristors is they lack controlled turn-off or current interruption capability. Turning off thyristors entails waiting for a zero-crossing current before they can be switched off. Therefore, thyristors cannot actively interrupt a current when the gate control current is removed. During an overcurrent fault, the wait for turn-off may allow the fault current to rise to relatively high levels, potentially damaging equipment.

In addition to traditional applications such as circuit breakers and Direct Current (DC) contactors which implement current interruption, the thyristor switch with an add-on current turn-off capability can also improve the performance of a Static Transfer Switch (STS) and micro-grid disconnect switch where thyristors are used as main power switches. A Typical STS utilizes a "break-before-make" approach for transferring the load from a preferred power source to an alternate power source power source when the STS detects a power quality event, and the disconnection time associated to turn off active thyristors is a significant part of the total transfer time. As a result, the transfer gap between turning off the active thyristors and turning on the inactive thyristors can sometimes be a full electrical cycle period. This long gap may impact the power quality at downstream loads.

Thus, it is desirable to improve the turn-off time for thyristors in order to improve their performance and use in a wide variety of solid-state switching applications.

BRIEF DESCRIPTION

In one aspect, a quasi-resonant turn-off circuit is provided. The quasi-resonant turn-off circuit is couplable in parallel with a pair of anti-parallel thyristors. The quasi-resonant turn-off circuit includes a resonant capacitor and an energy recovery circuit. The resonant capacitor is configured to supply a charge to the pair of anti-parallel thyristors to decrease a turn-off time of the pair of anti-parallel thyristors. The energy recovery circuit is configured to recharge the resonant capacitor using remnant energy left in parasitic inductances coupled to the quasi-resonant turn-off circuit after the pair of anti-parallel thyristors is off.

In another aspect, a solid-state switching apparatus is provided. The solid-state switching apparatus includes a pair of anti-parallel thyristors and a quasi-resonant turn-off circuit coupled in parallel with the pair of anti-parallel thyristors. The anti-parallel thyristors are configured to selectively couple a source with a load to conduct a load current The quasi-resonant turn-off circuit includes a resonant capacitor and an energy recovery circuit. The resonant capacitor is configured to supply a negative bias voltage to the pair of anti-parallel thyristors and commutate the load current from the pair of anti-parallel thyristors to the quasi-resonant turn-off circuit. The energy recovery circuit is configured to recharge the resonant capacitor using a decay current generated based on parasitic inductances coupled between the solid-state switching apparatus and the load after the pair of anti-parallel thyristors is off.

In another aspect, a solid-state switching apparatus is provided. The solid-state switching apparatus includes a thyristor and a quasi-resonant turn-off circuit coupled in parallel with the thyristor. The thyristor is configured to selectively couple a source with a load to conduct a load current. The quasi-resonant turn-off circuit includes a resonant capacitor and an energy recovery circuit. The resonant capacitor is configured to supply a negative bias to the thyristor and commutate the load current away from the thyristor to the quasi-resonant turn-off circuit to interrupt the load current. The energy recovery circuit is configured to recharge the resonant capacitor using remnant energy left in parasitic inductances coupled between the solid-state switching apparatus and the load after the thyristor is off.

DRAWINGS

These and other features, aspects, and advantages of the present disclosure will become better understood when the following detailed description is read with reference to the accompanying drawings in which like characters represent like parts throughout the drawings, wherein.

Figure 1:
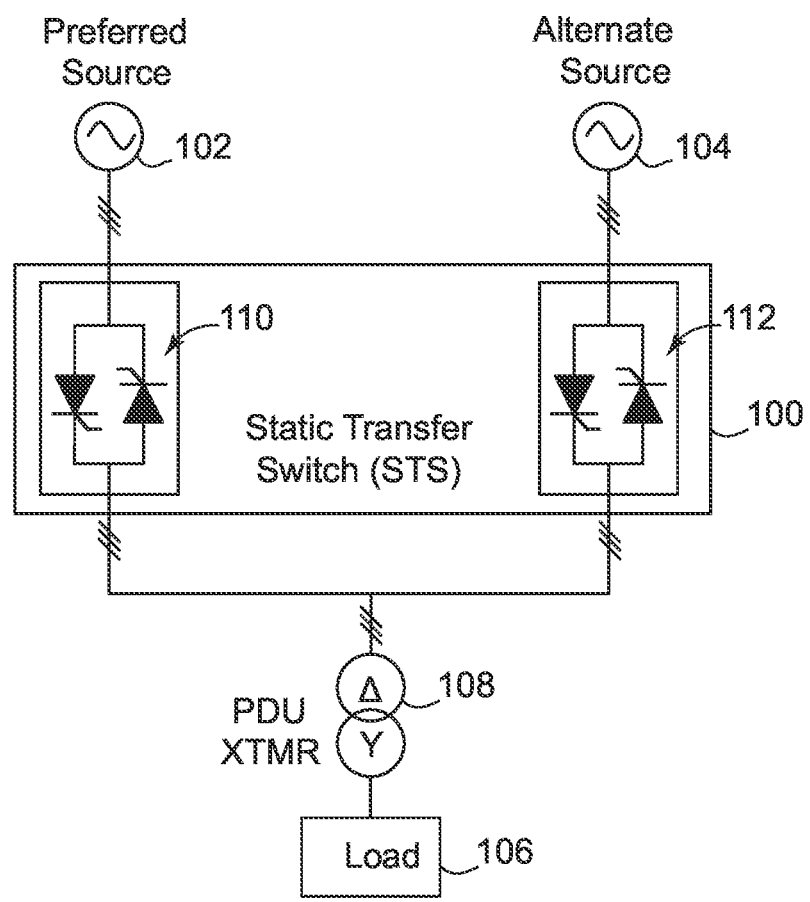
FIG. 1 depicts a known static transfer switch.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

FIG. 1 depicts a known Static Transfer Switch (STS) 100. STS 100 operates to couple either a preferred source 102 or an alternate source 104 to a load 106 (e.g., via a Power Distribution Unit (PDU) transformer 108). In FIG. 1, STS 100 includes a first pair of anti-parallel thyristors 110, which selectively conduct to electrically connect preferred source 102 to load 106, and a second pair of anti-parallel thyristors 112, which selectively conduct to electrically connect alternate source 104 to load 106.

When preferred source 102 has power quality issues, it's common that STS 100 transfers load 106 consecutively (e.g., up to five times) between preferred source 102 and alternate source 104 (e.g., using a break-before-make control scheme for thyristors 110, 112). For example, after STS 100 transfers load 106 from preferred source 102 to alternate source 104, STS 100 may transfer load 106 back to preferred source 102 from alternate source 104 (e.g., within a few milliseconds) in case the power quality issues at preferred source 102 are temporary. If power quality issues remain at preferred source 102, STS 100 will once again transfer load 106 back to alternate source 104. The transfer of load 106 back and forth between preferred source 102 and alternate source 104 may occur up to five times before a final decision is made by STS 100 to utilize alternate source 104 to power load 106.

Figure 2:
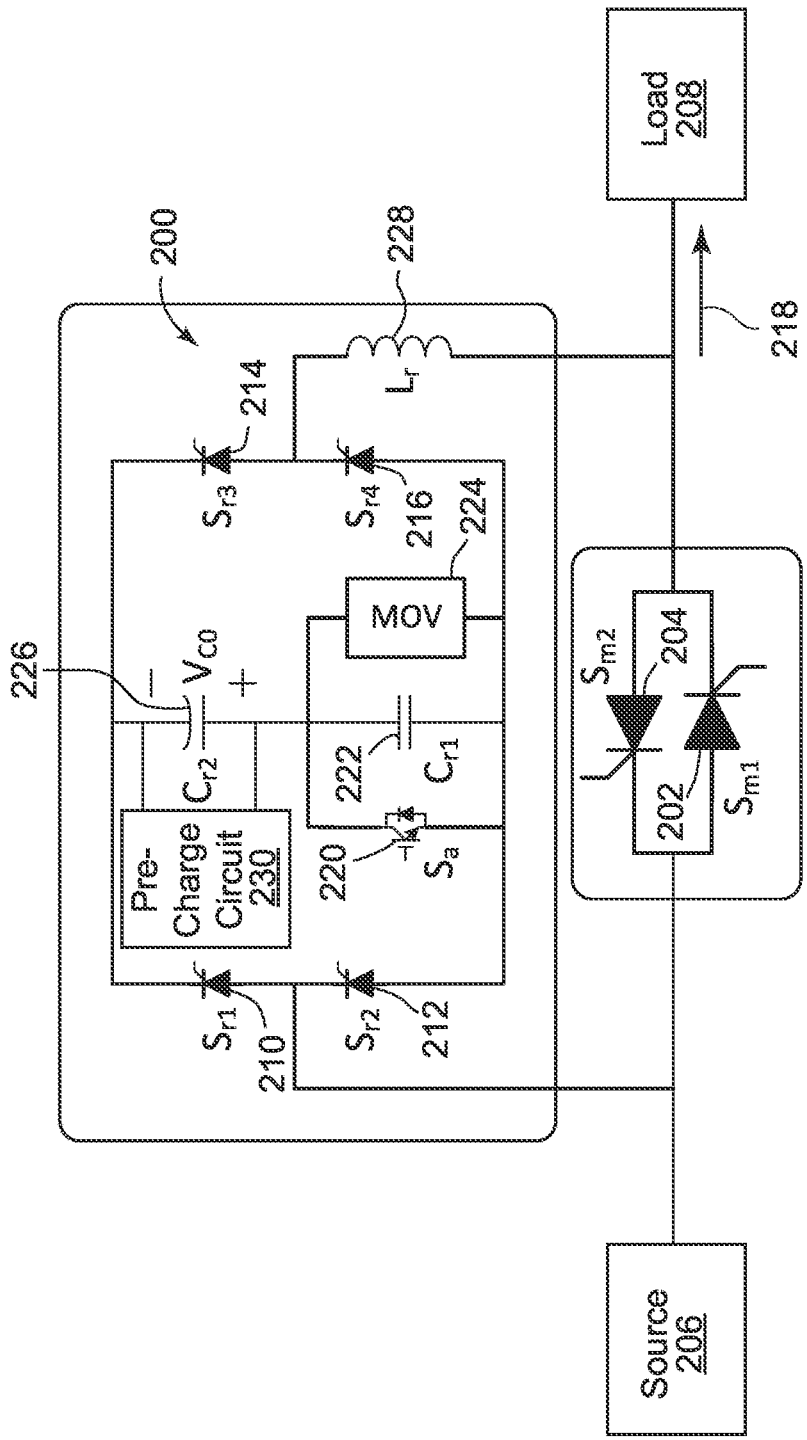
FIG. 2 depicts a quasi-resonant turn-off circuit in an example embodiment.

FIG. 2 depicts a quasi-resonant turn-off circuit 200 in an example embodiment. Turn-off circuit 200 in this embodiment is used to accelerate the turn-off of a pair of anti-parallel thyristors 202 ($S_{m1}$), 204 ($S_{m2}$) that selectively couple a source 206 with a load 208. Thyristors 202, 204 may, for example, be used as the main power devices in a static transfer switch. Source 206 and load 208 include AC sources/loads or DC sources/loads in various embodiments.

In this embodiment, turn-off circuit 200 includes any component, system, or device that accelerates the turn-off time for thyristors 202, 204 by interrupting the current through thyristors 202, 204. When it is desired to interrupt the current between source 206 and load 208, turn-off circuit 200 is activated to commutate the current flowing through thyristors 202, 204 to turn-off circuit 200, which decreases the current flowing through thyristors 202, 204. Commutating the current from thyristors 202, 204 to turn-off circuit 200 decreases the current level in thyristors 202, 204 quickly to zero or to a level below the holding current for thyristors 202, 204, in a relatively short time (e.g., less than about 20 microseconds). In addition, turn-off circuit 200 can apply a reverse bias voltage to thyristors 202, 204 (e.g., a reverse bias voltage from about thirty volts to about fifty volts) to reduce the turn-off time of thyristors 202, 204. Although a duration of the application of the reverse bias voltage applied to thyristors 202, 204 can vary depending the application, the duration varies from about 150 microseconds to about 200 microseconds in different embodiments. Subsequent to the application of the reverse bias voltage to thyristors 202, 204, thyristors 202, 204 will be in condition to be deactivated or turned off. Turn-off circuit 200 may then be deactivated, thereby completing the disconnection of source 206 from load 208.

In this embodiment, turn-off circuit 200 includes auxiliary thyristors 210 ($S_{r1}$), 212 ($S_{r2}$), 214 ($S_{r3}$), 216 ($S_{r4}$) that provide turn-off circuit 200 a reconfigurable bridge that varies a conduction path depending on the direction of a current 218, which defines whether thyristor 202 is conducting or whether thyristor 204 is conducting. When a turn-off process occurs to disconnect source 206 from load 208 during a positive half-cycle for current 218, auxiliary thyristors 210 ($S_{r1}$), 216 ($S_{r4}$) are forward biased to commutate current 218 away from thyristor 202 to turn-off circuit 200. When a turn-off process occurs to disconnect source 206 from load 208 during a negative half-cycle for current 218, auxiliary thyristors 212, 214 are forward biased to commutate current 218 away from thyristor 204 to turn-off circuit 200.

In the embodiment of FIG. 2, turn-off circuit 200 further includes an auxiliary transistor 220 ($S_a$), illustrated as an Insulated Gate Bipolar Transistor (IGBT) in FIG. 2, although auxiliary transistor 220 may include other types of devices in other embodiments. Turn-off circuit 200 further includes a first resonant capacitor 222 (Cri) in parallel with auxiliary transistor 220 and a snubber 224 in parallel with first resonant capacitor 222 and auxiliary transistor 220. Snubber 224 may include any type of circuit used as a transient voltage clamp, including a Metal Oxide Varistor (MOV). Turn-off circuit 200 in this embodiment further includes a second resonant capacitor 226 ($C_{r2}$) in series with the parallel combination of auxiliary transistor 220, first resonant capacitor 222, and snubber 224. In some embodiments, turn-off circuit 200 includes a pre-charge circuit 230 in parallel with second resonant capacitor 226. The pre-charge circuit is used to charge second resonant capacitor 226 to a voltage (e.g., from about thirty volts to about fifty volts), which is used to apply a reverse bias voltage to thyristors 202, 204 during turn-off of thyristors 202, 204. A resonant inductor 228 ($L_r$) has a first terminal coupled between the cathode of auxiliary thyristor 216 and the anode of auxiliary thyristor 214, and a second terminal coupled to load 208 side of thyristors 202, 204. Resonant inductor 228 may include the parasitic inductance in the connections between turn-off circuit 200 and load 208 and/or thyristors 202, 204.

In turn-off circuit 200 of FIG. 2, second resonant capacitor 226, in some embodiments, is pre-charged (e.g., via a pre-charge circuit 230) to a relatively low voltage and provides a resonant current to create a zero-crossing current and reverse bias voltage for thyristors 202, 204. Second resonant capacitor 226, in some embodiments, also provides a reverse bias voltage through auxiliary transistor 220 for thyristors 202, 204 after current 218 has been commutated away from thyristors 202, 204 through turn-off circuit 200, providing time for thyristors 202, 204 to finish an internal carrier recombination process and enable thyristors 202, 204 to turn off. Auxiliary transistor 220 is turned off, and current 218 is commutated from auxiliary transistor 220 to first resonant capacitor 222. First resonant capacitor 222 limits the rate of voltage change (dv/dt) of thyristors 202, 204 to prevent thyristors 202, 204 from being triggered back on. When the voltage of first resonant capacitor 222 reaches a significant level, including, for example, a level at which first resonant capacitor 222 is limited by snubber 224, current 218 is decreased to zero or interrupted. Auxiliary thyristors 210, 212, 214, 216 are turned off, which completes the turn-off process. In some embodiments, the total time to interrupt current 218 during a turn-off process is less than about three hundred and fifty microseconds.

Figure 3:
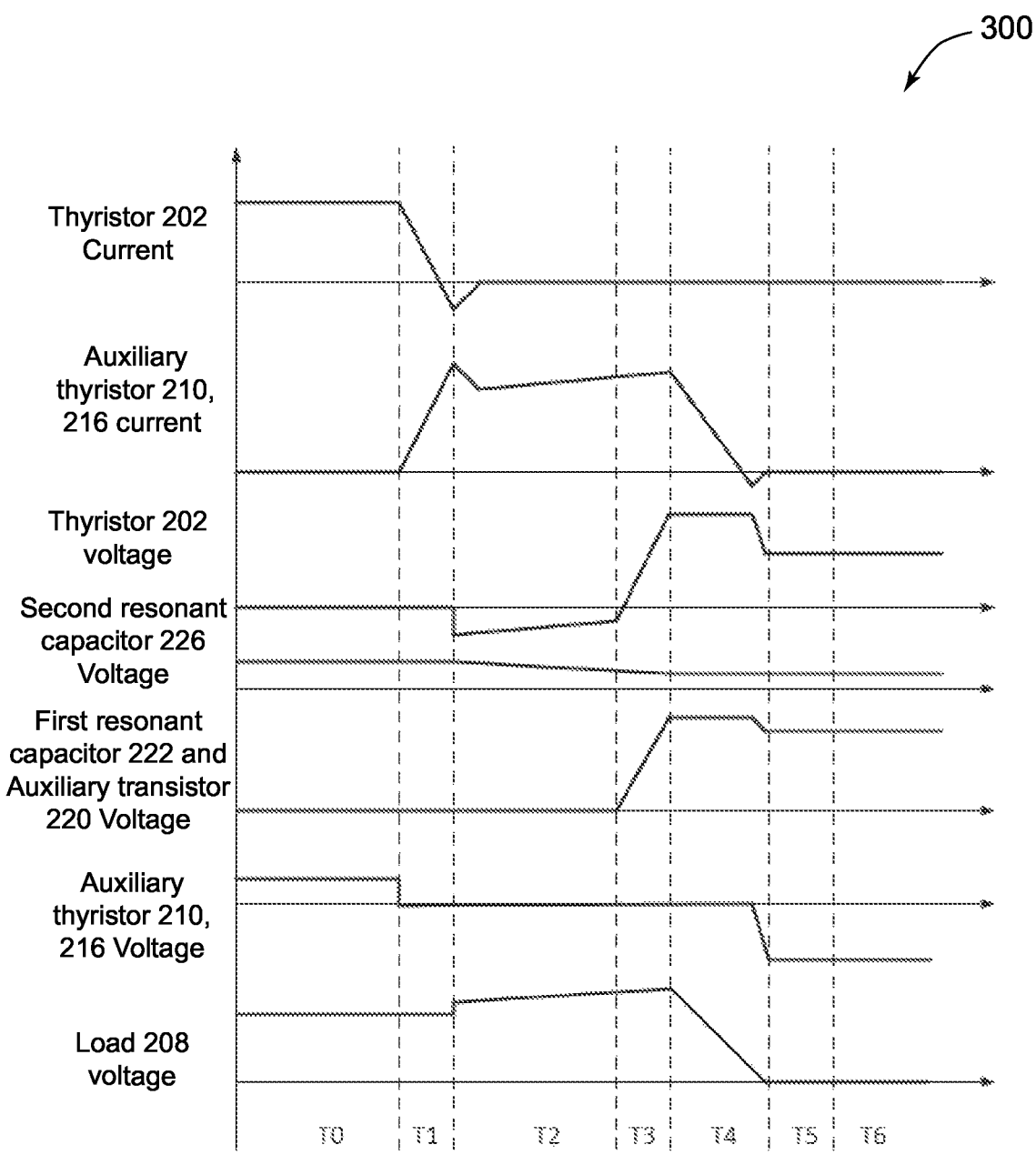
FIG. 3 depicts current waveforms of currents and voltages for the quasi-resonant turn-off circuit of FIG. 2 in an example embodiment.

FIG. 3 depicts waveforms 300 of currents and voltages for turn-off circuit 200, thyristors 202, 204, and a voltage of load 208 during a turn-off process in an example embodiment. In particular, waveforms 300 depict the current and voltages during a positive half-cycle for current 218 when thyristor 202 is conducting, although the discussion is similar to when current 218 is negative and thyristor 204 is conducting, with the differences generally being which of auxiliary thyristors 210, 212, 214, 216 are conducting.

During an initial time period T0 depicted in FIG. 3, thyristor 202 is conducting (e.g., current 218 has a positive non-zero value), and turn-off circuit 200 is off (e.g., auxiliary thyristors 210, 212, 214, 216, and auxiliary transistor 220 are off). At the end of time period T0, a turn-off command is received to disconnect source 206 from load 208, and at T1 auxiliary thyristors 210, 216 and auxiliary transistor 220 are turned on in order to commutate current 218 flowing through thyristor 202 to turn-off circuit 200. T1 defines a first resonance period of the turn-off process. As depicted in FIG. 3, current through thyristor 202 is decreasing and currents through auxiliary thyristors 210, 216 are increasing. During the time period T1, resonance starts between second resonant capacitor 226 and resonant inductor 228, and resonant current flows through auxiliary thyristor 210, second resonant capacitor 226, auxiliary transistor 220, auxiliary thyristor 216, and resonant inductor 228.

Resonant inductor 228 may be used to limit the rate of change (di/dt) of the resonant current flowing through resonant inductor 228 to provide a soft commutation of thyristor 202. During the time period T1, thyristor 202 exhibits a zero-crossing current as the resonant current through second resonant capacitor 226 rises. Also, during the time period T1, a reverse recovery current may be associated with thyristor 202, depicted as the negative transition in FIG. 3 for the current through thyristor 202, which allows some carrier recombination to occur within thyristor 202. Some charges may remain trapped within thyristor 202 however, so the time period T2 is used to complete the carrier recombination within thyristor 202 as second resonant capacitor 226 applies a reverse bias voltage to thyristor 202. In this regard, the time period T2 is adjusted in some embodiments to ensure that carrier recombination within thyristor 202 is completed during the time period T2. Also, during the time period T2, current 218 is fully commutated away from thyristor 202 and is carried by turn-off circuit 200 through auxiliary thyristor 210, second resonant capacitor 226, auxiliary transistor 220, auxiliary thyristor 216, and resonant inductor 228.

At the end of the time period T2, auxiliary transistor 220 is turned off and current 218 is commutated to first resonant capacitor 222. The voltage across auxiliary transistor 220 and first resonant capacitor 222 rises, with the time period T3 defining a second resonance period in the turn-off process. During the time period T3, first resonant capacitor 222 limits the rate of voltage rise (dv/dt) across thyristor 202, in order to prevent a high dv/dt across thyristor 202 from triggering thyristor 202 to turn back on. Depending on the magnitude of current 218, the voltage across first resonant capacitor 222 may trigger snubber 224 near the end of the time period T3, with snubber 224 operating to clamp the voltage across first resonant capacitor 222 as depicted within the time period T4.

With snubber 224 active during the time period T4, snubber 224 dissipates energy flowing through turn-off circuit 200, and the current through auxiliary thyristors 210, 216 and resonant inductor 228 decreases until a zero-crossing current occurs for auxiliary thyristors 210, 216. The voltage across load 208 also decreases. After current 218 exhibits a zero-crossing current, the resonant current through turn-off circuit 200 may be interrupted after a brief reverse recovery current is applied to auxiliary thyristors 210, 216 when they are reverse biased, which deactivates turn-off circuit 200.

Although the above discussion has been outlined with respect to a positive half-cycle for current 218 when thyristor 202 is conducting, a similar process occurs for a negative half-cycle for current 218 when thyristor 204 is conducting, with the difference being that auxiliary thyristors 212, 214 are conducting during a turn-off process during a negative half-cycle for current 218 rather than auxiliary thyristors 210, 216 as discussed for the positive half-cycle for current 218. The operation of auxiliary transistor 220, first resonant capacitor 222, second resonant capacitor 226, snubber 224, and resonant inductor 228 is similar when commutating current away from thyristor 204 to turn-off circuit 200 as previously described above for thyristor 202.

The above example is applicable to both unidirectional and bidirectional current systems that can utilize other types of power, including direct current and multi-phase current applications. In addition, instead of having both thyristors 202, 204 as depicted in FIG. 2, some embodiments (e.g., Direct Current (DC) embodiments) include only a single thyristor 202. In DC embodiments, rather than having a first pair of auxiliary thyristors 210, 216 and a second pair of auxiliary thyristors 212, 214 forming a selectable bridge circuit based on the polarity of current 218, turn-off circuit 200 includes a single pair of auxiliary thyristors 210, 216 in order to commutate the current away from a single thyristor 202.

Although turn-off circuit 200 operates effectively to quickly interrupt current 218 during a turn-off process (e.g., in significantly less time than a half-cycle of current 218), turn-off circuit 200 may be less effective in applications where turn-off circuit 200 is tasked with performing multiple current interruption processes in quick succession, such as when a static transfer switch utilizes turn-off circuit 200 for its main thyristors and the static transfer switch repeatedly transfers a load between a preferred source and an alternate source. In these implementations, the charge on second resonant capacitor 226 can quickly decrease to a point where turn-off circuit 200 is ineffective in quickly turning off thyristors 202, 204.

Figure 4:
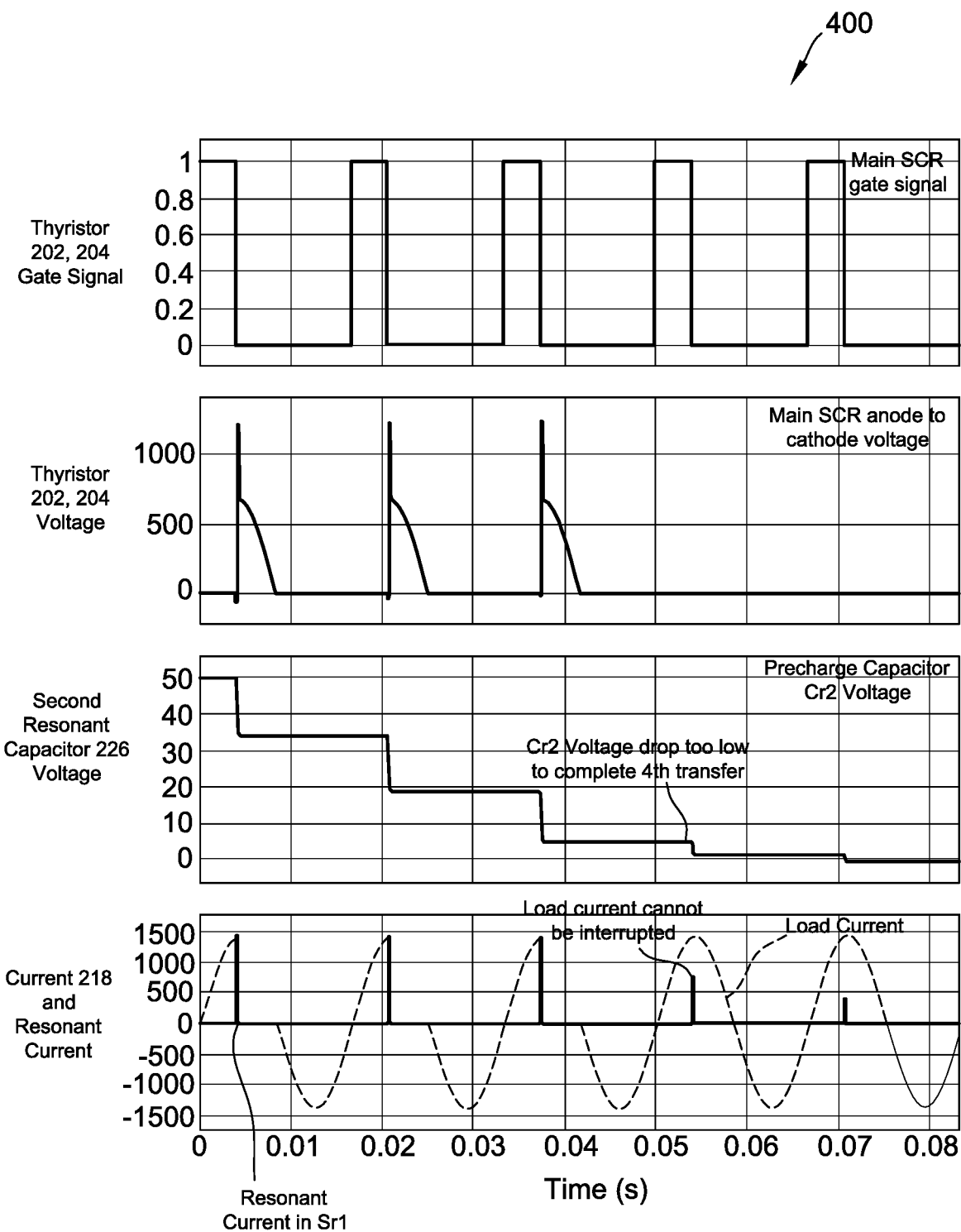
FIG. 4 depicts waveforms of currents and voltages for the quasi-resonant turn-off circuit of FIG. 2 during a five-time sequential current interruption simulation in an example embodiment.
Figure 5:
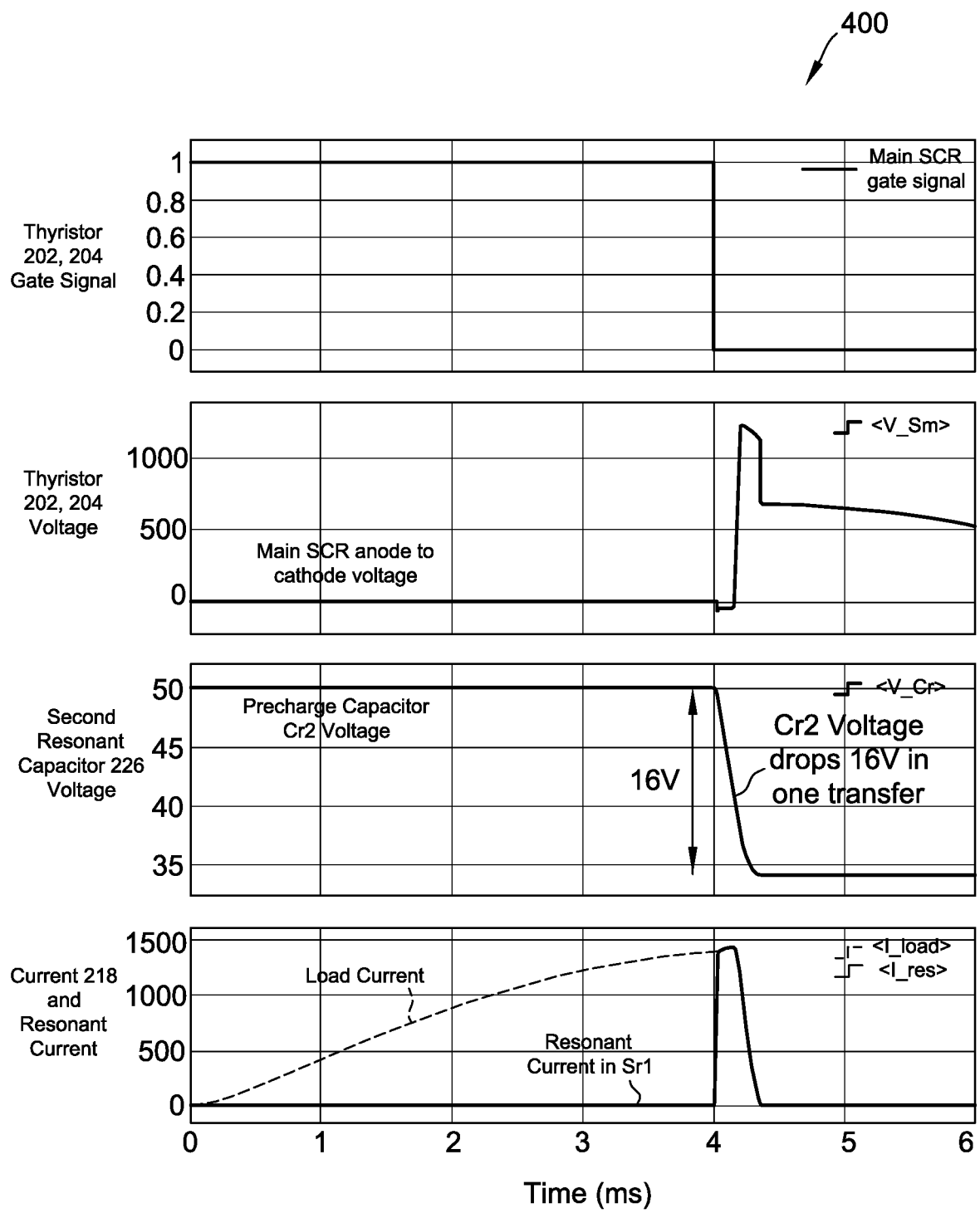
FIG. 5 depicts the waveforms of FIG. 4 during a first current interruption process in an example embodiment.

FIG. 4 depicts waveforms 400 of currents and voltages for turn-off circuit 200 during a five-time sequential current interruption simulation in an example embodiment. For the simulation, second resonant capacitor 226 (Ca) has a value of twenty one milli-farads, the pre-charge voltage for second resonant capacitor 226 is fifty volts, resonant inductor 228 ($L_r$) has a value of one hundred microhenries, and the clamping voltage of snubber 224 is thirteen hundred volts. During the simulation, turn-off circuit 200 attempts to consecutively interrupt a fourteen hundred amp value of current 218 five times in each system cycle (sixty hertz). During the simulation, turn-off circuit 200 is only capable of interrupting current 218 three times, due to the discharge of second resonant capacitor 226. FIG. 5 depicts waveforms 400 during the first current interruption process (i.e., from time zero to about six milliseconds in FIG. 4), showing that the voltage of second resonant capacitor 226 drops from about fifty volts prior to interrupting current 218 to about thirty four volts in an example embodiment.

Although pre-charge circuit 230 may be used to replace the lost charge of second resonant capacitor 226 during a sequence of closely-timed turn-off events for thyristors 202, 204, pre-charge circuit 230 may be tasked with supplying a large amount of current in a short amount of time, thereby entailing the use of a high-power pre-charge circuit 230. However, a high-power pre-charge circuit 230 may be expensive and/or bulky, which is undesirable. Another option to enable turn-off circuit 200 to operate through five or more current interruption events may be to increase the capacitance of second resonant capacitor 226, by, for example, paralleling additional capacitors to store a sufficient amount of energy for second resonant capacitor 226 to retain enough charge to complete up to five transfers generated by a static transfer switch. However, adding additional capacitors or larger capacitors used to implement second resonant capacitor 226 in this option may increase the cost and/or size of turn-off circuit 200, which may be difficult to implement in the space and/or cost constraints associated with retrofitting an existing static transfer switch. Yet another option may be to increase the pre-charge voltage on second resonant capacitor 226 to ensure that second resonant capacitor 226 has enough energy to complete the five consecutive transfers, however, a high pre-charge voltage on second resonant capacitor 226 may cause an overvoltage on load 208 during thyristor 202, 204 turn-off. Further, a high pre-charge voltage on second resonant capacitor 226 entails the use of capacitors with a higher voltage rating, which may be expensive and/or increase the volume of the capacitor implementation for second resonant capacitor 226.

In the embodiments described herein, enhancements to turn-off circuit 200 are provided, including an energy recovery circuit which performs a recharge process on second resonant capacitor 226 during turn-off events, enabling second resonant capacitor 226 to maintain a sufficient voltage and provide the ability to successfully implement consecutive turn-off events (e.g., up to five consecutive turn-off events). The energy recovery circuit precludes the use of a high-power pre-charge circuit 230, additional capacitance for second resonant capacitor 226, or a higher working voltage specification for second resonant capacitor 226, thereby reducing the cost, size, and complexity for turn-off circuits.

Figure 6:
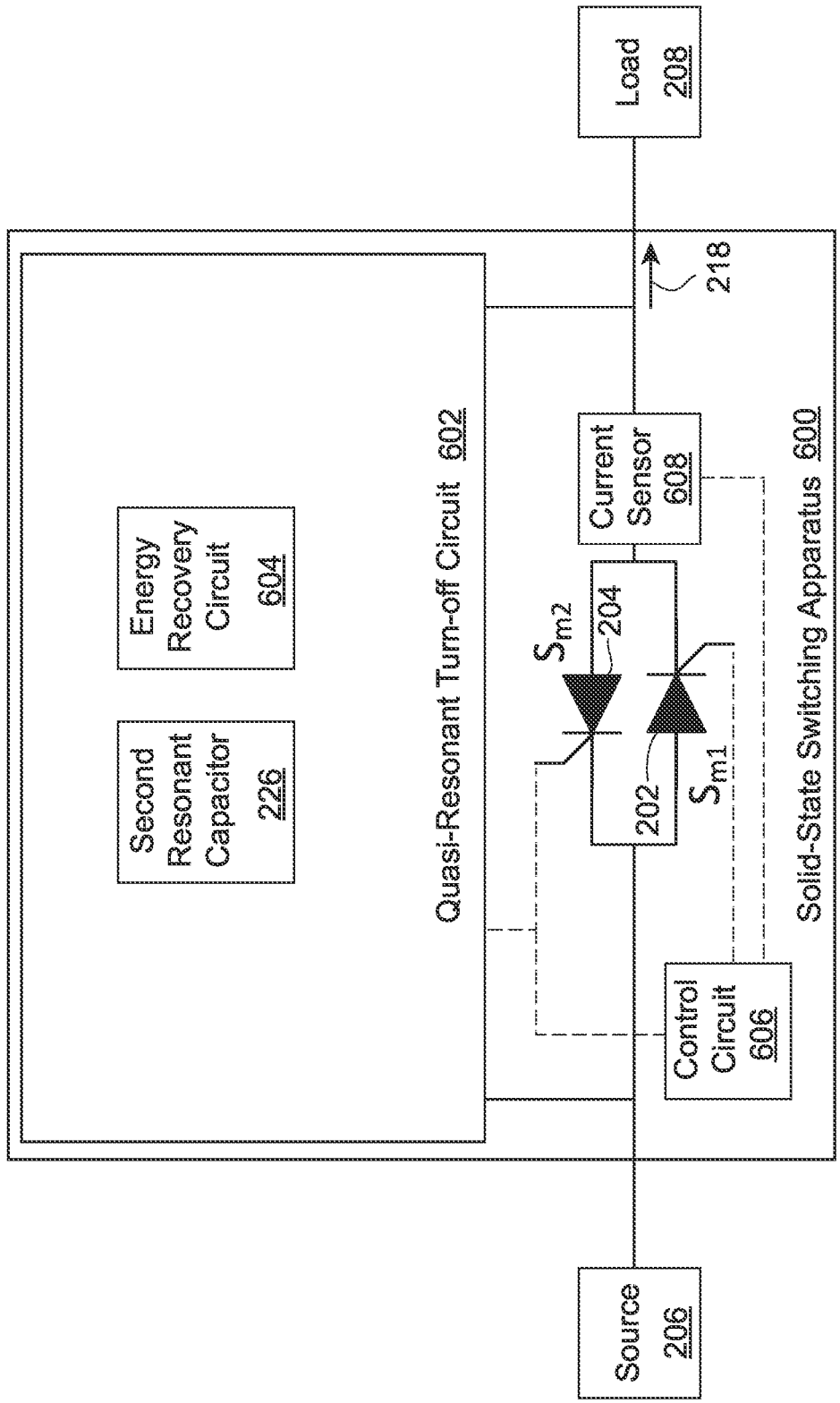
FIG. 6 depicts a solid-state switching apparatus in an example embodiment.

FIG. 6 depicts a solid-state switching apparatus 600 in an example embodiment. In this embodiment, solid-state switching apparatus 600 includes a quasi-resonant turn-off circuit 602, which includes an energy recovery circuit 604 and second resonant capacitor 226. Energy recovery circuit 604 includes any component, system, or device that recharges second resonant capacitor 226 during turn-off events for thyristors 202, 204. Turn-off circuit 602 includes any component, system, or device that accelerates the turn-off time for thyristors 202, 204 by interrupting current 218 through thyristors 202, 204. When it is desired to interrupt the current between source 206 and load 208, turn-off circuit 602 is activated to commutate current 218 from thyristors 202, 204 to turn-off circuit 602, which decreases the current flowing through thyristors 202, 204. Commutating current 218 from thyristors 202, 204 to turn-off circuit 602 decreases the current level in thyristors 202, 204 quickly to zero or to a level below the holding current for thyristors 202, 204, in a relatively short time (e.g., less than about twenty microseconds). In addition, turn-off circuit 602 can apply a reverse bias voltage to thyristors 202, 204 using second resonant capacitor 226 (e.g., a reverse bias voltage from about thirty volts to about fifty volts) to reduce the turn-off time of thyristors 202, 204. Subsequent to the application of the reverse bias voltage to thyristors 202, 204, thyristors 202, 204 will be in condition to be deactivated or turned off. During the turn-off process, energy recovery circuit 604 is used to replace the charge lost on second resonant capacitor 226, thereby enabling turn-off circuit 602 to be effective in successive current interruption events for current 218 that would typically occur when solid-state switching apparatus 600 is used in a static transfer switch. Turn-off circuit 602 may then be deactivated, thereby completing the disconnection of load 208 from source 206.

In this embodiment, solid-state switching apparatus 600 includes a control circuit 606, and a current sensor 608. Control circuit 606 includes any component, system, or device that controls the operation of solid-state switching apparatus 600. Control circuit 606 may be used, for example, to control the gate signals for thyristors 202, 204, modify the operation of turn-off circuit 602 depending on the direction of current 218, etc. Current sensor 608 includes any component, system, or device that senses current 218 and provides information to control circuit 606 that allows control circuit 606 to determine the magnitude and polarity of current 218, which is used to determine which of thyristors 202, 204 is conducting.

Figure 7:
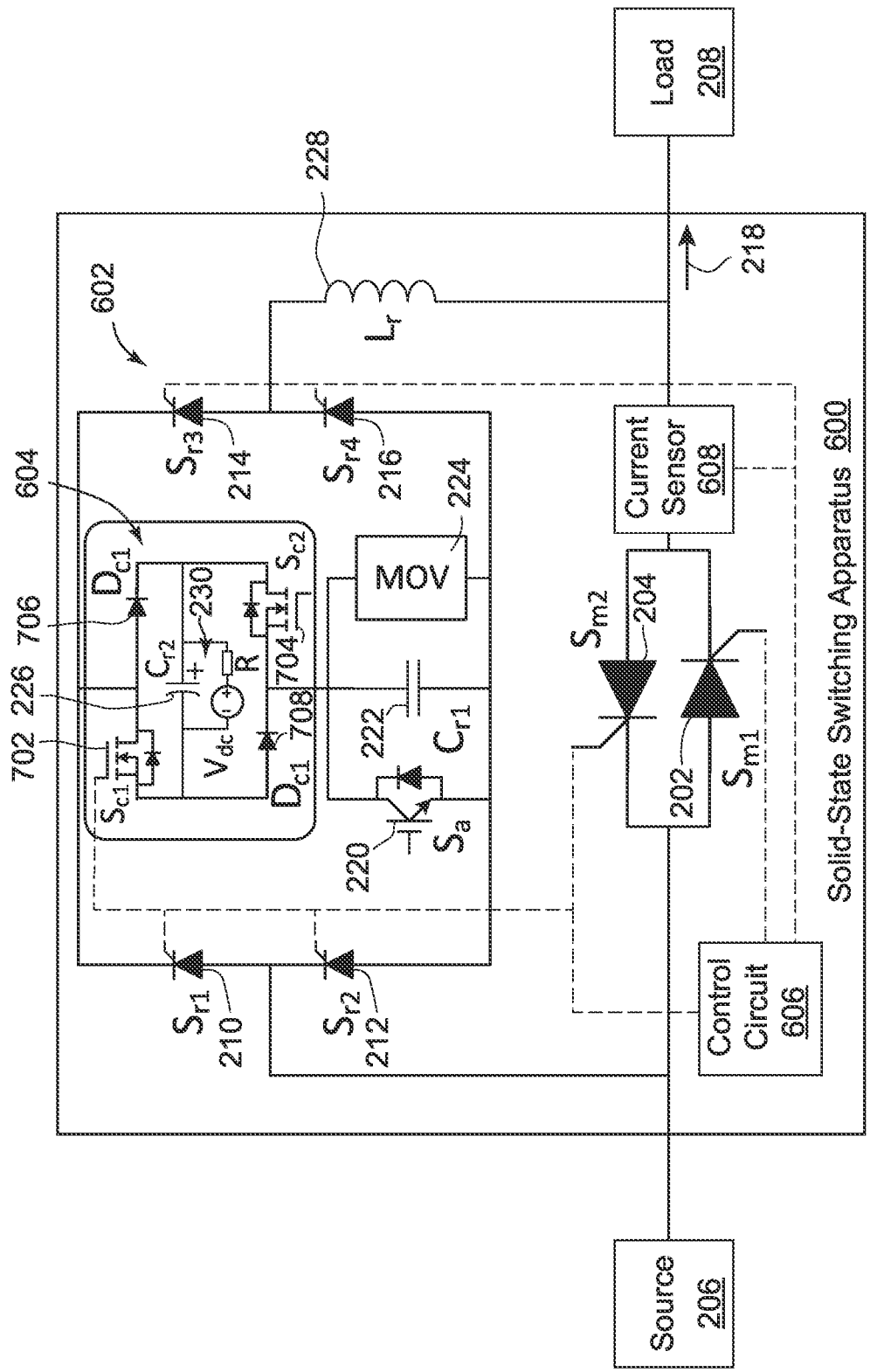
FIG. 7 depicts a solid-state switching apparatus in another example embodiment.

FIG. 7 depicts solid-state switching apparatus 600 in another example embodiment. In this embodiment, turn-off circuit 602 includes similar components as turn-off circuit 200 of FIG. 2 (e.g., auxiliary thyristors 210, 212, 214, 216, auxiliary transistor 220, first resonant capacitor 222, snubber 224, second resonant capacitor 226, resonant inductor 228, and pre-charge circuit 230), which may operate the same or similar to the functionality described with respect to turn-off circuit 200. In addition, turn-off circuit 602 in this embodiment includes switches 702 ($S_{c1}$) 704, ($S_{c2}$) and diodes 706 ($D_{c1}$), 708 ($D_{c2}$), which collectively form energy recovery circuit 604 for turn-off circuit 602 that was previously described with respect to FIG. 6. Although switches 702, 704 are depicted as n-channel enhancement mode Metal Oxide Semiconductor Field Effect Transistors (MOSFETs) in this embodiment, switches 702, 704 have other configurations and types in other embodiments of energy recovery circuit 604. Further, the dashed lines from control circuit 606 represent one or more control signals used by control circuit 606 to operate the various components depicted in FIG. 7.

Generally, switches 702, 704 and diodes 706, 708 form a bridge for second resonant capacitor 226. When auxiliary transistor 220 is on during the turn-off process for thyristors 202, 204, switches 702, 704 are also on, which applies a reverse bias voltage from second resonant capacitor 226 to the anode of one of thyristors 202, 204 (depending on the configuration of auxiliary thyristors 210, 212, 214, 216) to finish an internal carrier recombination process for one of thyristors 202, 204. After a pre-defined time period, auxiliary transistor 220 is turned off and current 218 will commutate from auxiliary transistor 220 to first resonant capacitor 222. Switches 702, 704 are turned off, and current 218 will commutate from switches 702, 704 to diodes 706, 708, charging second resonant capacitor 226. Once second resonant capacitor 226 is charged back up to a pre-set voltage, switches 702, 704 may be turned back on again to bypass second resonant capacitor 226, thereby avoiding overcharging second resonant capacitor 226. In this embodiment, pre-charge circuit 230 is a low-power supply, and is used to initially charge second resonant capacitor 226 to its pre-set voltage, which is between about thirty volts to about fifty volts in this embodiment. Pre-charge circuit 230 may also be used to mitigate the leakage current associated with second resonant capacitor 226 and ensure that second resonant capacitor 226 remains at or about its pre-charge voltage prior to beginning a turn-off process for thyristors 202, 204. Thus, pre-charge circuit 230 in this embodiment may have a power rating around a few tens of watts, thereby precluding the use of a relatively high-power supply, because second resonant capacitor 226 is recharged during the turn-off process by energy recovery circuit 604 rather than by pre-charge circuit 230.

Figure 8A:
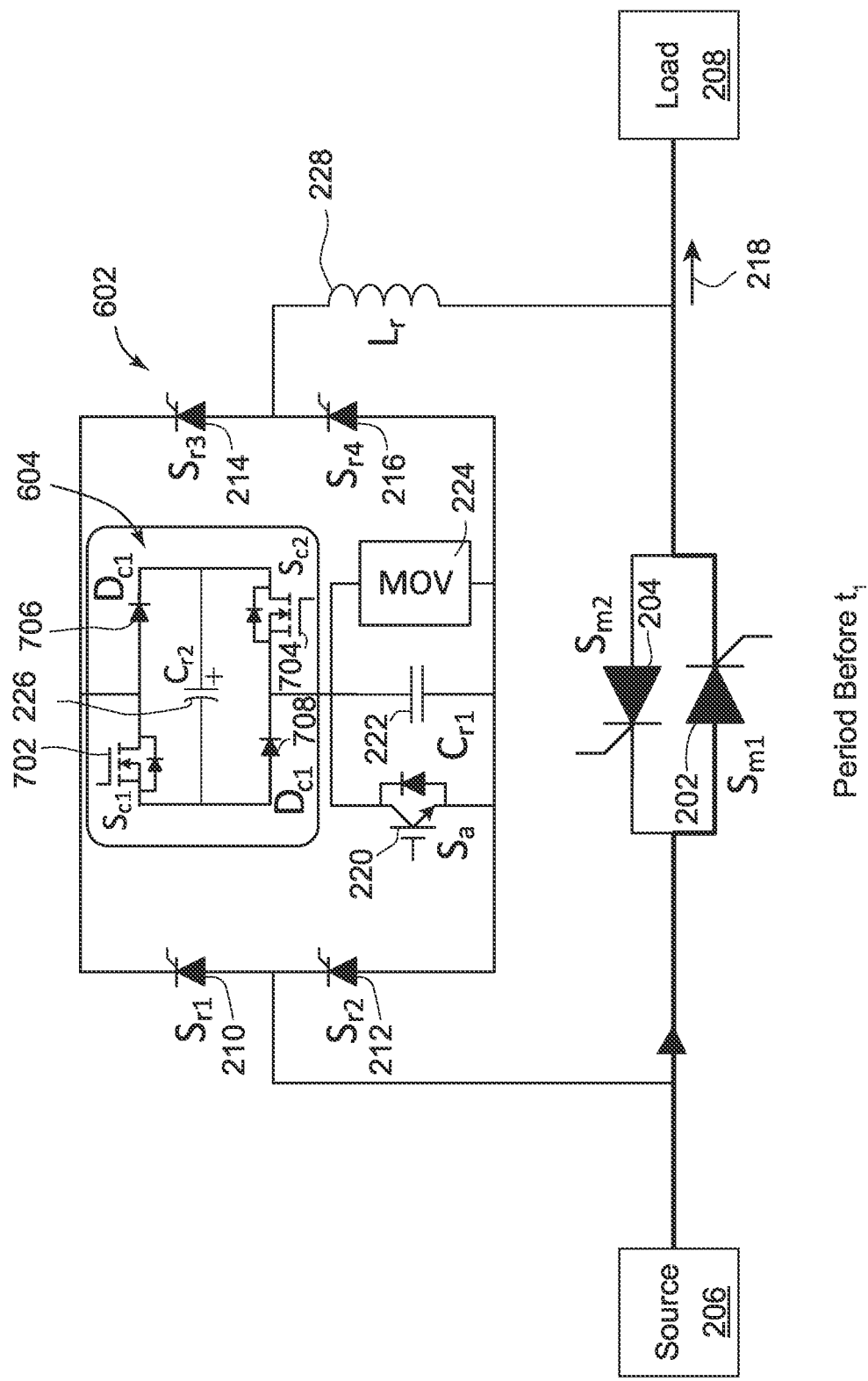
FIGS. 8A-8D depict different operating modes of a turn-off circuit in an example embodiment.
Figure 8B:
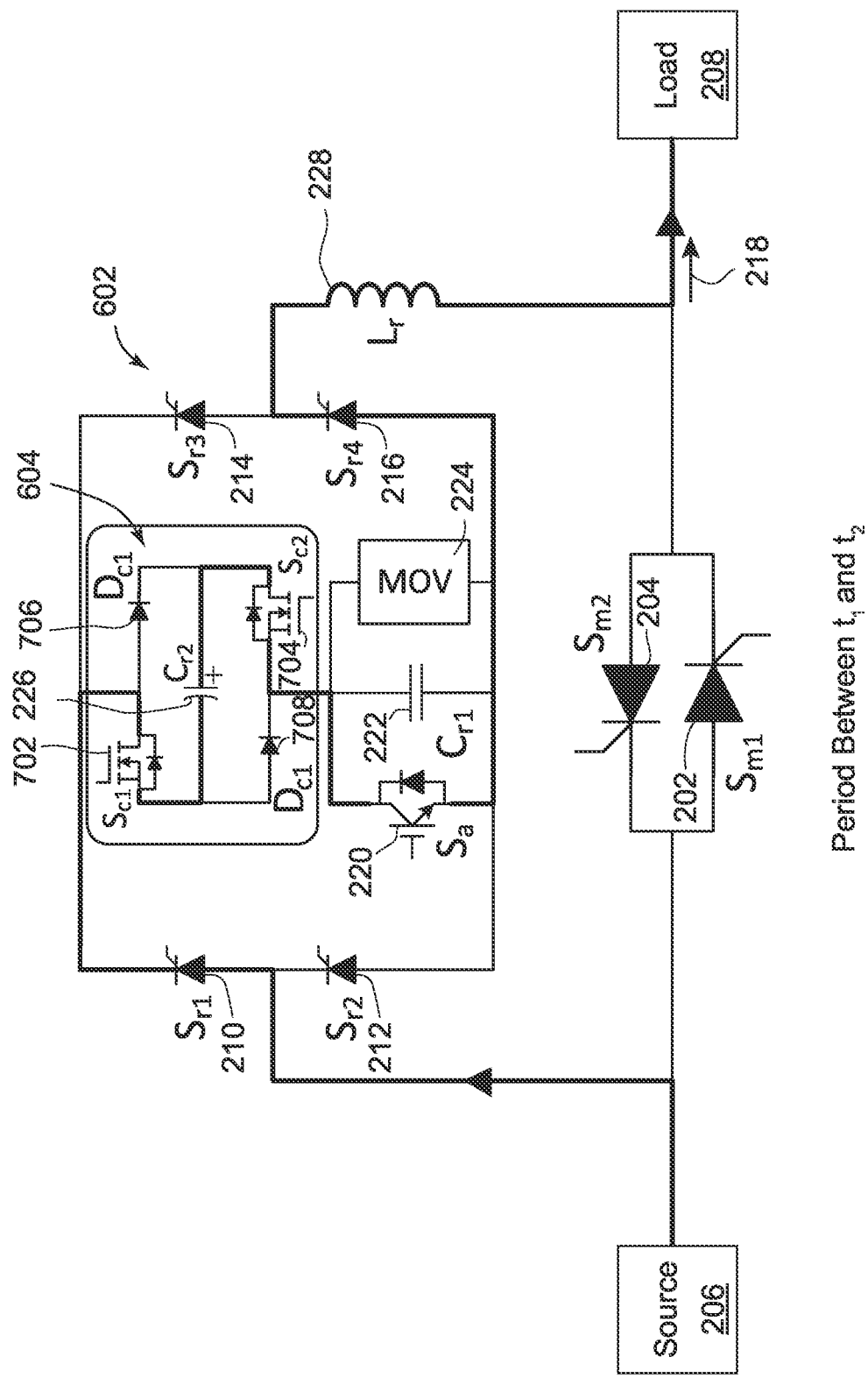
Figure 8C:
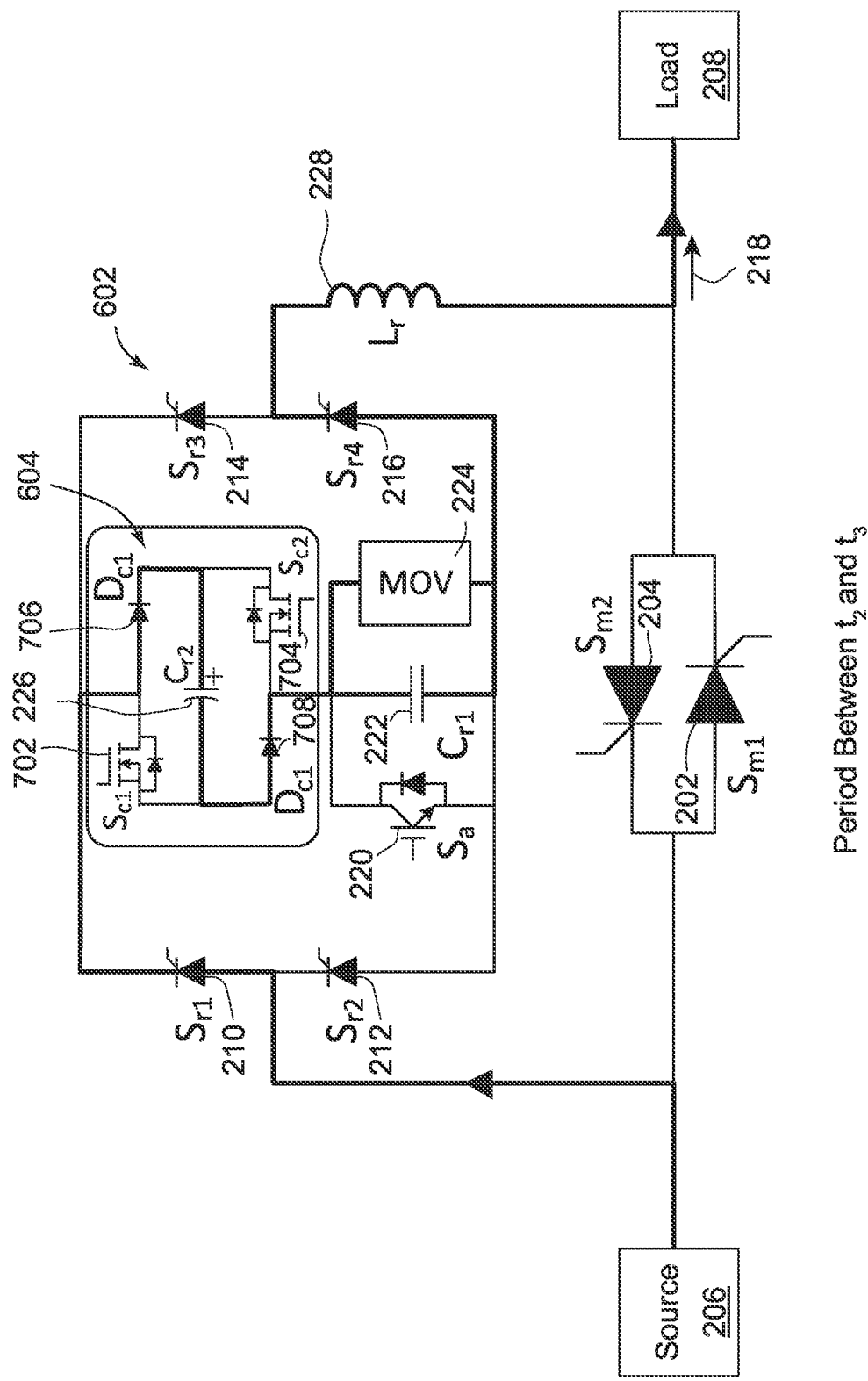
Figure 8D:
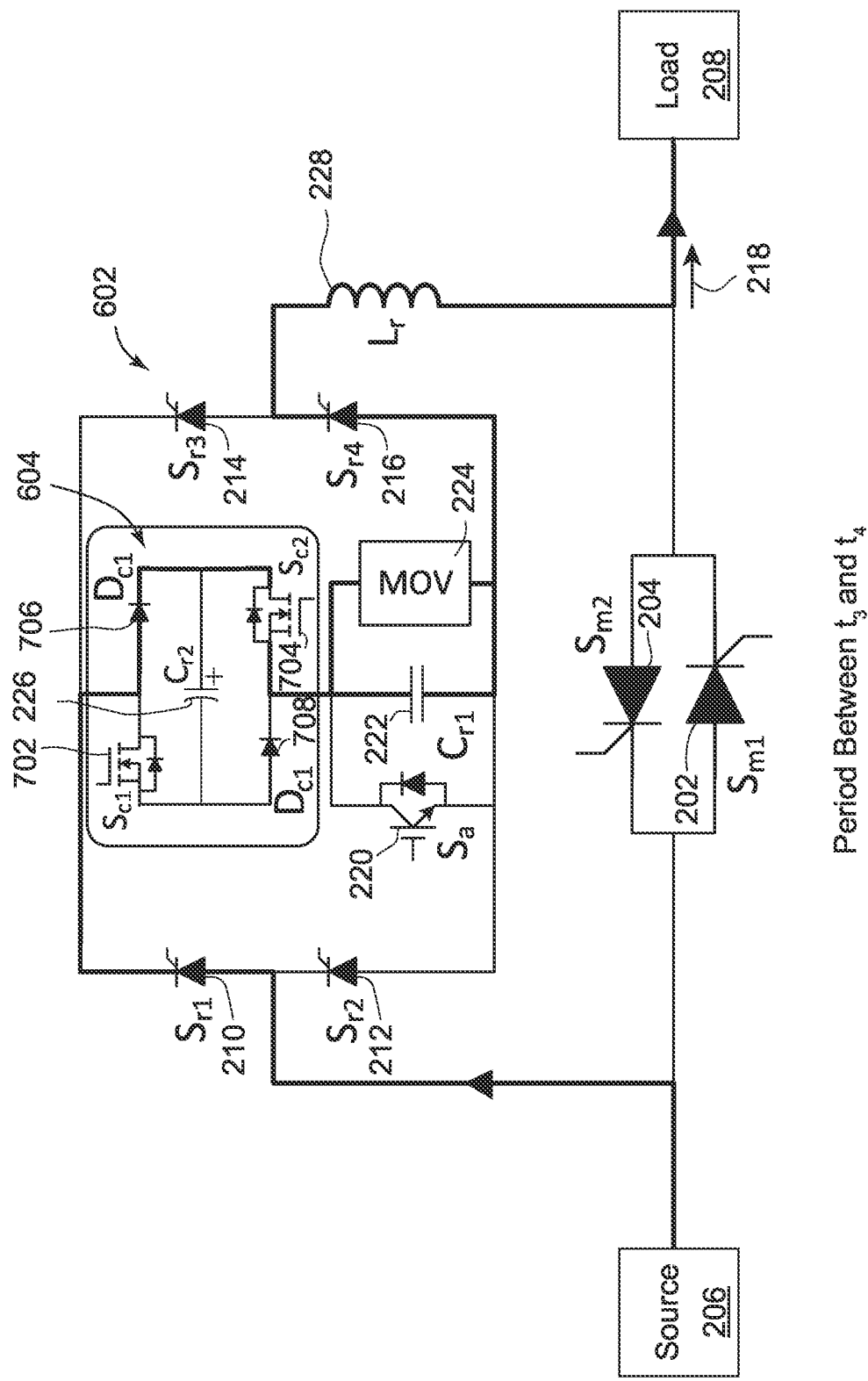
Figure 9:
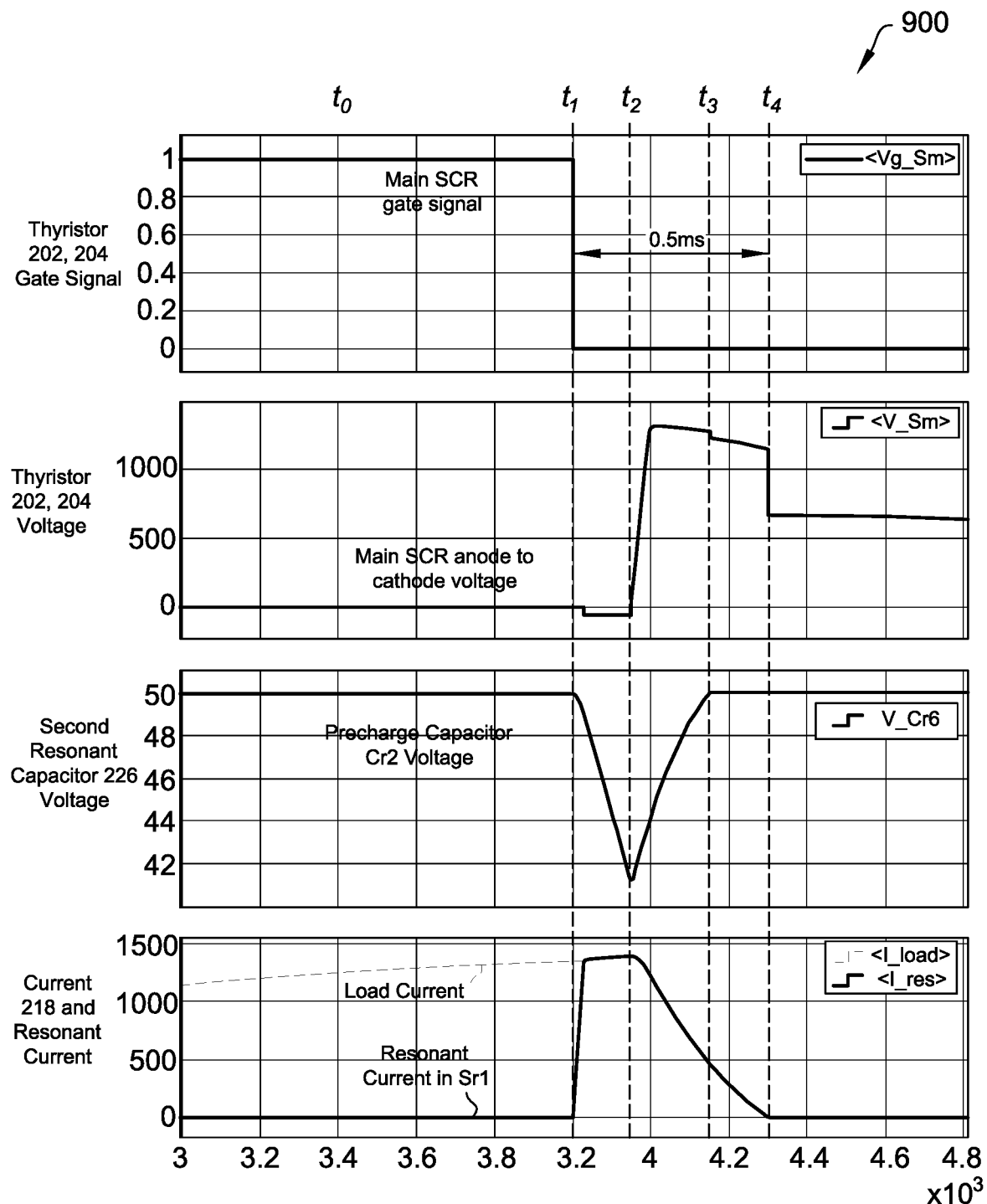
FIG. 9 depicts waveforms of voltages and currents during the different operating modes of FIGS. 8A-8D in an example embodiment.

FIGS. 8A-8D depict different operating modes of turn-off circuit 602 in an example embodiment, and FIG. 9 depicts waveforms 900 of voltages and currents during the different operating modes of turn-off circuit 602 in an example embodiment.

The operating modes depicted in FIGS. 8A-8D and waveforms 900 depicted in FIG. 9 correspond to a state when thyristor 202 is conducting, although the operation may be similar to when thyristor 204 is conducting, with the difference being which of auxiliary thyristors 210, 212, 214, 216 are conducting.

When current 218 is in its positive half-cycle, thyristor 202 is conducting as depicted at the time period $t_0$-$t_1$. Turn-off circuit 602 is off, with auxiliary thyristors 210, 212, 214, 216, auxiliary transistor 220, and switches 702, 704 also off. See FIG. 8A.

When a turn-off process starts at $t_1$ (e.g., via a command received by control circuit 606 or some other trigger, such as a power quality issue with source 206 detected by control circuit 606), auxiliary thyristors 210, 216, auxiliary transistor 220, and switches 702, 704 are turned on (e.g., by control circuit 606 of FIG. 6) to initiate the turn-off process for thyristor 202.

From time period $t_1$ to t2 (see FIG. 8B), current 218 is forced to commutate from thyristor 202 to turn-off circuit 602 by the pre-charged voltage of second resonant capacitor 226. A reverse bias voltage from second resonant capacitor 226 is applied to the anode of thyristor 202 to speed up the turn-off of thyristor 202. Current 218 discharges second resonant capacitor 226 and the voltage of second resonant capacitor 226 is dropping during time period $t_1$ to t2 as depicted in FIG. 9. Generally, the energy stored by second resonant capacitor 226 is large enough to maintain the voltage polarity and reverse bias to thyristor 202.

At $t_2$, thyristor 202 is ready to block forward voltage and auxiliary transistor 220 is turned off, as depicted in FIG. 8C. Switches 702, 704 are also turned off, and a resonant current flows through diodes 706, 708 and charges second resonant capacitor 226, as shown in FIG. 9. At time t3, the voltage across second resonant capacitor 226 may reach the pre-set voltage if the inductance of resonant inductor 228 is high enough.

From time period t3 to t4, switch 704 is turned on again to bypass second resonant capacitor 226 and avoid overcharging second resonant capacitor 226 as shown in FIG. 8D and FIG. 9. After time t4, current 218 is interrupted, switch 704 is turned off, and load 208 is disconnected from source 206.

Figure 10:
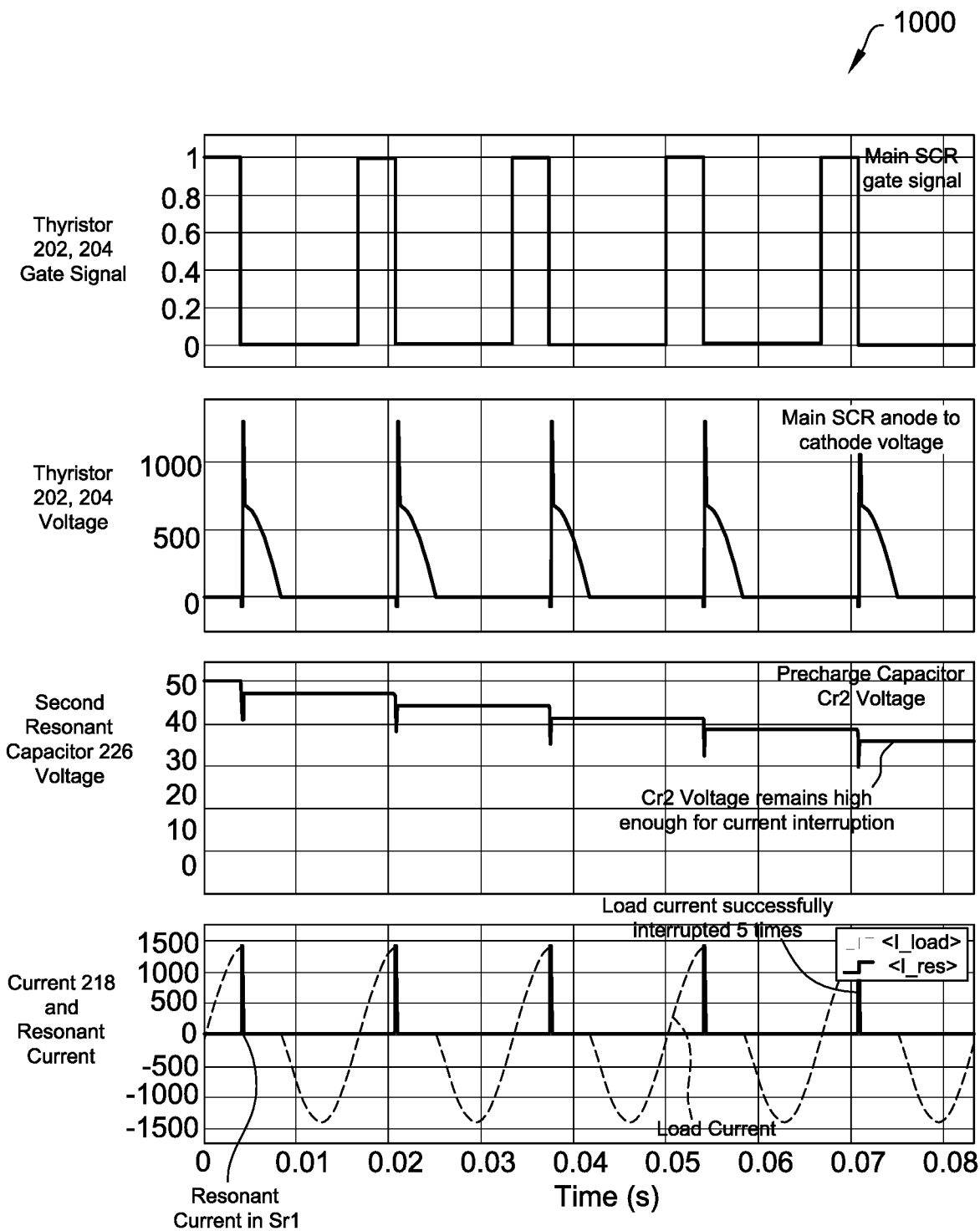
FIG. 10 depicts simulation waveforms for a turn-off circuit during a five-time sequential current interruption simulation in an example embodiment.
Figure 11:
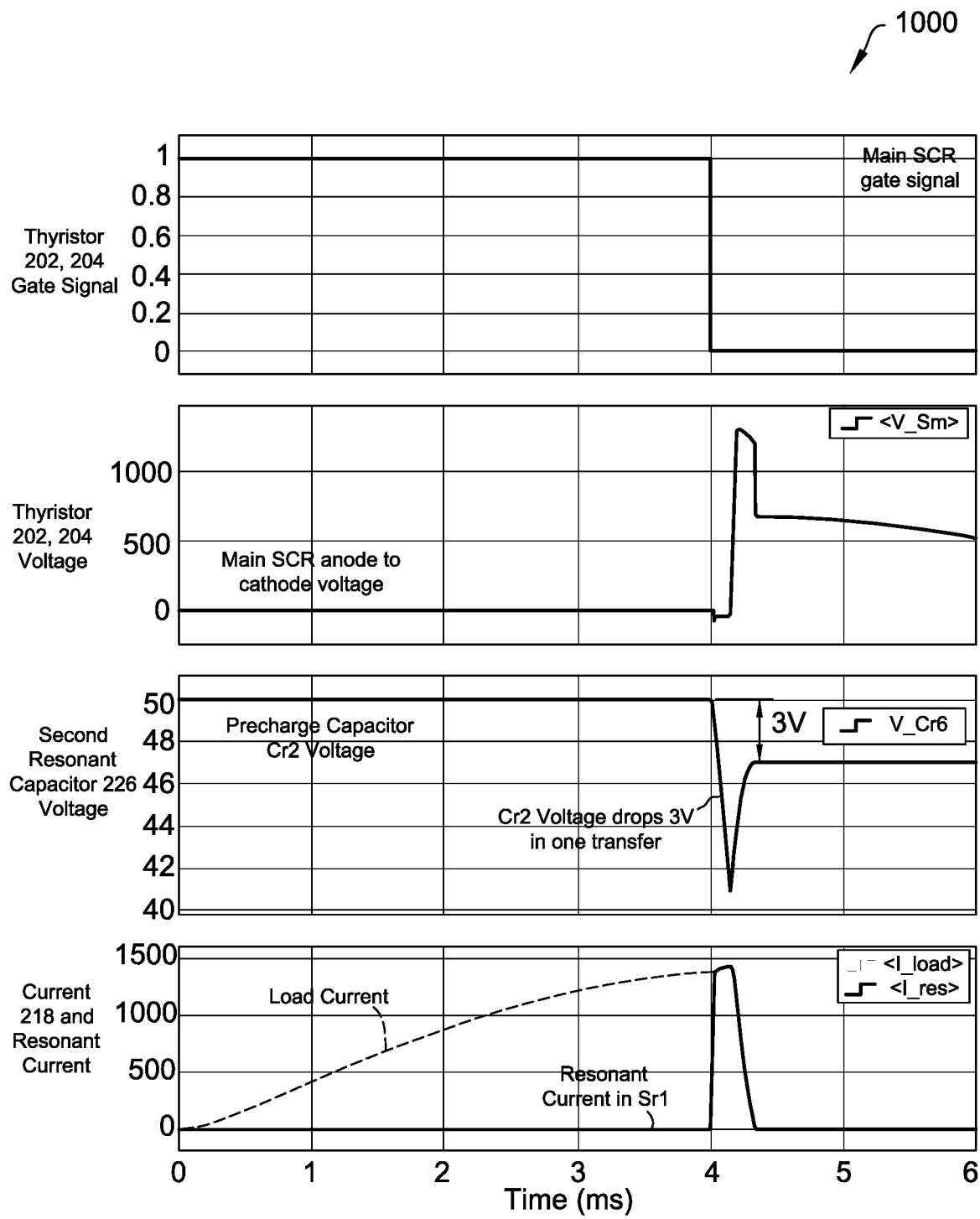
FIG. 11 depicts the waveforms of FIG. 10 during the first current interruption process in an example embodiment.

FIG. 10 depicts simulation waveforms 1000 for turn-off circuit 602 during a five-time sequential current interruption simulation in an example embodiment. The simulation depicted in FIG. 10 utilizes the same simulated conditions as the simulation depicted in FIG. 4 for turn-off circuit 200. FIG. 11 depicts simulation waveforms 1000 during the first current interruption process (i.e., from time zero to about six milliseconds in FIG. 10), showing that the voltage of second resonant capacitor 226 drops from about fifty volts prior to interrupting current 218 to about thirty four volts, and then is recharged back to about forty seven volts using energy recovery circuit 604. This enables turn-off circuit 602 to successfully interrupt a fourteen hundred amp value of current 218 consecutively for five times while maintaining a sufficient voltage on second resonant capacitor to reverse bias thyristor 202, an improvement over turn-off circuit 200. As previously discussed, the higher the value of the parasitic inductances (represented by resonant inductor 228), the higher the voltage of second resonant capacitor 226 is charged back to. The one hundred microhenry parasitic inductance value used in the simulations of turn-off circuit 200 and turn-off circuit 602 are typical values considering cable parasitic inductances and downstream transformer leakage inductances.

Figure 12:
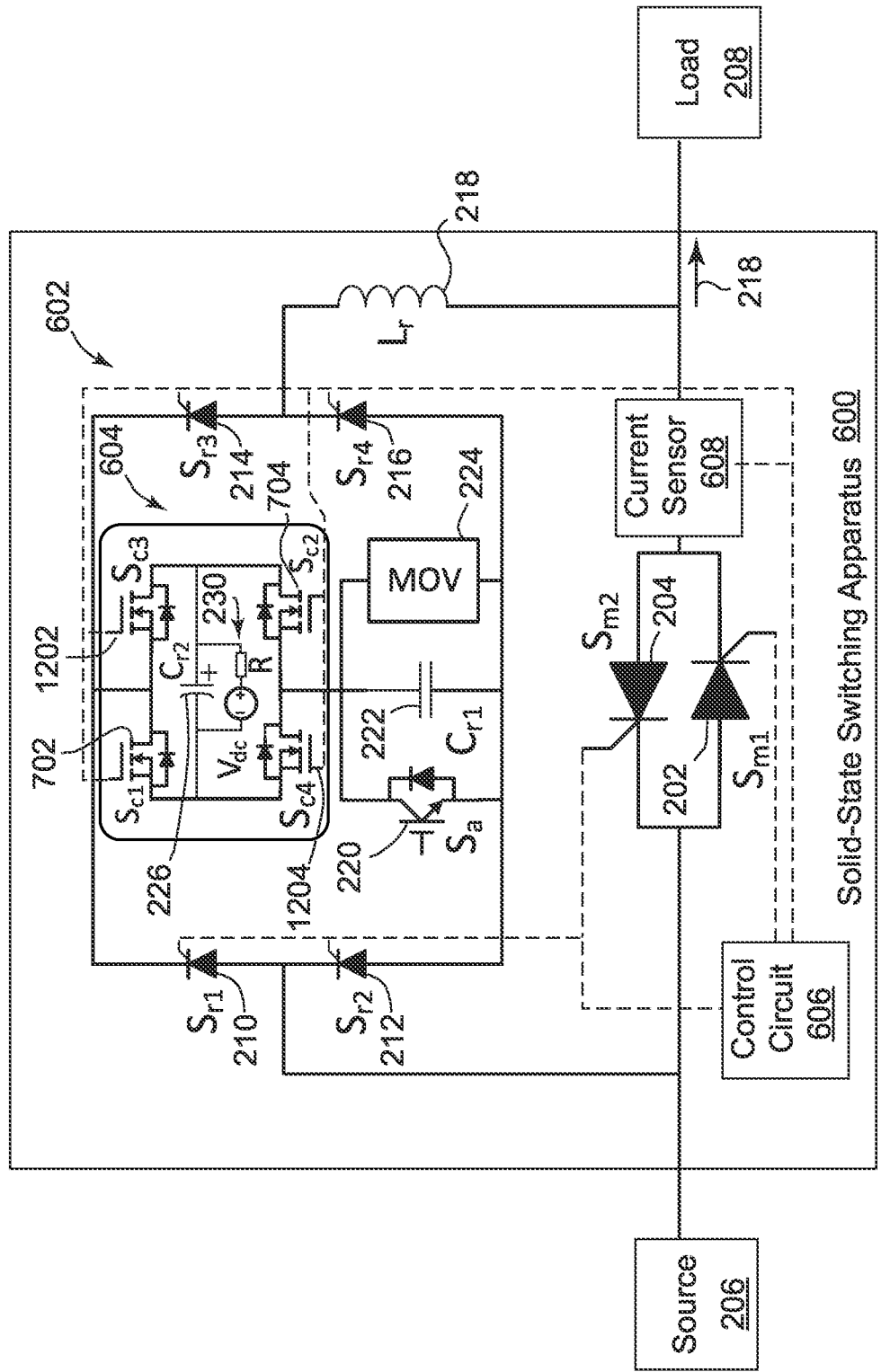
FIG. 12 depicts a solid-state switching apparatus in another example embodiment.

FIG. 12 depicts solid-state switching apparatus 600 in another example embodiment. In this embodiment, turn-off circuit 602 has been modified to replace diodes 706, 708 with switches 1202 ($S_{c3}$), 1204 ($S_{c4}$), respectively. In this embodiment, control circuit 606 operates switches 1202, 1204 to selectively conduct to perform the functionality previously performed by diodes 706, 708, during the period between t2 and t3 as depicted in FIG. 8C. The use of switches 1202, 1204 implements a full bridge for energy recovery circuit 604. Further, the dashed control signals from control circuit 606 represent one or more control signals used by control circuit 606 to operate the various components depicted in FIG. 12.

Figure 13:
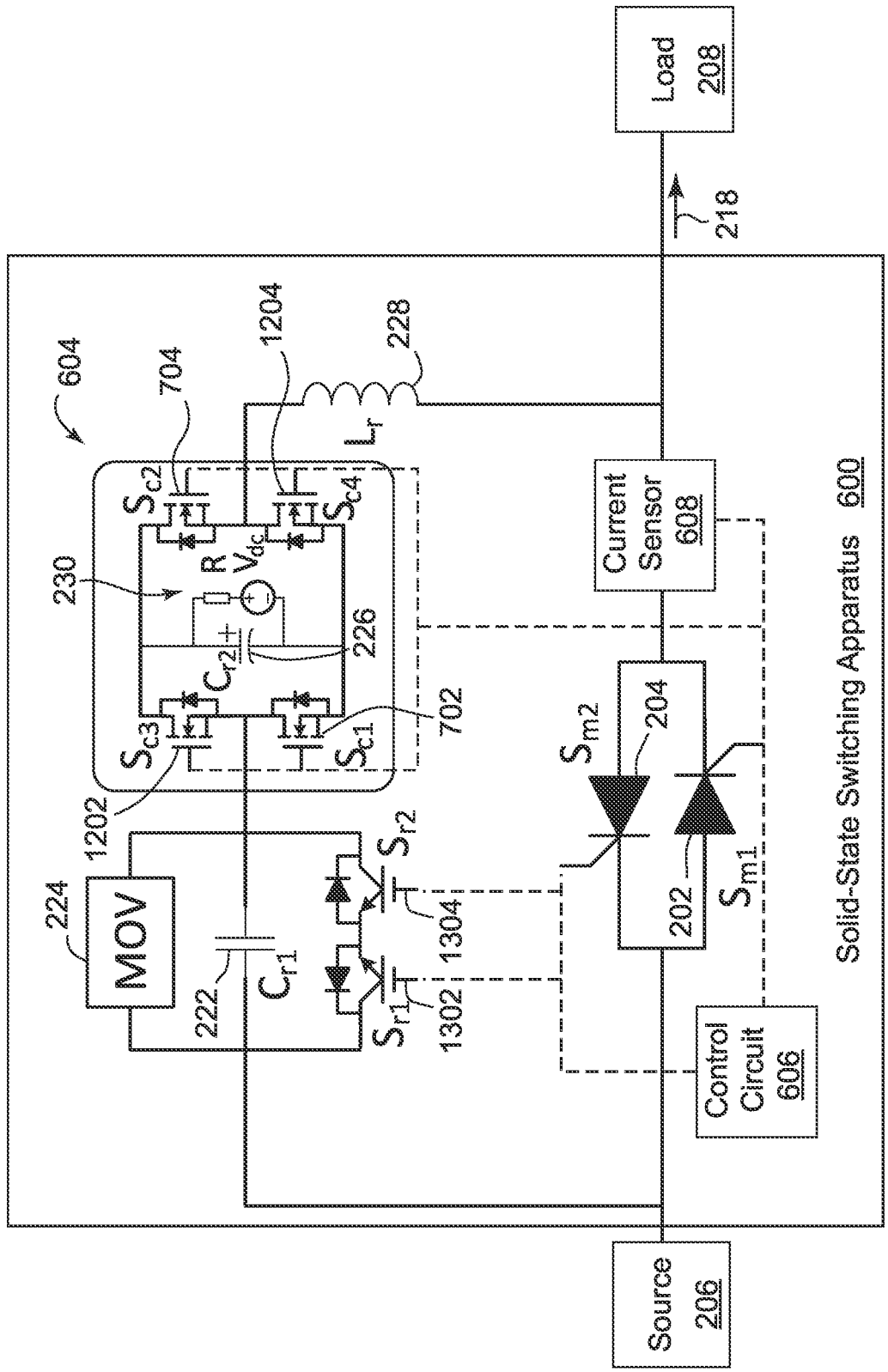
FIG. 13 depicts a solid-state switching apparatus in another example embodiment.

FIG. 13 depicts solid-state switching apparatus 600 in another example embodiment. In this embodiment, turn-off circuit 602 has been modified to replace diodes 706, 708 with switches 1202 ($S_{c3}$), 1204 ($S_{c4}$), respectively. In this embodiment, control circuit 606 operates switches 1202, 1204 to selectively conduct to perform the functionality previously performed by diodes 706, 708, during the period between t2 and t3 as depicted in FIG. 8C. The use of switches 1202, 1204 implements a full bridge for energy recovery circuit 604. Further, auxiliary thyristors 210, 212, 214, 216 have been removed, and Insulated Gate Bipolar Transistors (IGBTs) 1302, 1304 are arranged in an anti-series configuration, with first resonant capacitor 222 and snubber 224 arranged in parallel with the anti-series configuration for IGBTs 1302, 1304. In this embodiment, IGBTs 1302, 1304 perform the functionality of auxiliary transistor 220, and switches 702, 704, 1202, 1204 operate in pairs based on the polarity of current 218 similar to the pairs of auxiliary thyristors 210, 212, 214, 216 of FIG. 7. Further, the dashed control signals from control circuit 606 represent one or more control signals used by control circuit 606 to operate the various components depicted in FIG. 13.

An example technical effect of the apparatus described herein includes one or more of: (a) providing fast turn-off capability to thyristors; (b) providing a low-cost add-on turn-off circuit option for existing thyristor drive circuits; (c) the turn-off circuit does not conduct during normal operation, and does not generate a power loss during normal operation; (d) the turn-off circuit does not require high capacitance values to operate, thereby mitigating the use of large capacitor banks; (e) the resonant inductance in the turn-off circuit is small and can utilize the parasitic inductance in existing power cables; and (f) the turn-off circuit is capable of supporting multiple sequential current interruptions using an energy recovery circuit.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A quasi-resonant turn-off circuit couplable in parallel with a pair of anti-parallel thyristors, wherein the quasi-resonant turn-off circuit comprises:
   a resonant capacitor configured to supply a charge to the pair of anti-parallel thyristors to decrease a turn-off time of the pair of anti-parallel thyristors; and
   an energy recovery circuit configured to recharge the resonant capacitor using remnant energy left in parasitic inductances coupled to the quasi-resonant turn-off circuit after the pair of anti-parallel thyristors is off.

2. The quasi-resonant turn-off circuit of claim 1, wherein:
   the energy recovery circuit comprises at least two switches configured to selectively reverse a polarity of the resonant capacitor after the pair of anti-parallel thyristors is off.

3. The quasi-resonant turn-off circuit of claim 2, wherein:
   the at least two switches are configured to be turned on when the resonant capacitor supplies the charge to the pair of anti-parallel thyristors.

4. The quasi-resonant turn-off circuit of claim 3, wherein:
   the at least two switches are configured to be turned off while the energy recovery circuit recharges the resonant capacitor.

5. The quasi-resonant turn-off circuit of claim 4, wherein:
   the energy recovery circuit further comprises at least two additional switches that are configured to be turned on to recharge the resonant capacitor.

6. The quasi-resonant turn-off circuit of claim 1, wherein:
   the energy recovery circuit comprises:
      a first leg comprising a first switch and a first diode connected by a first node; and
      a second leg coupled in parallel with the first leg, the second leg comprising a second switch and a second diode connected by a second node, and
      wherein the resonant capacitor is coupled in parallel with the first leg and the second leg.

7. The quasi-resonant turn-off circuit of claim 6, further comprising:
   a first branch comprising a first auxiliary thyristor and a third auxiliary thyristor connected by a third node; and
   a second branch coupled in parallel with the first branch, the second branch comprising a second auxiliary thyristor and a fourth auxiliary thyristor connected by a fourth node, and
   wherein the energy recovery circuit is coupled in series with a parallel combination of another resonant capacitor, a voltage clamping device, and an auxiliary transistor between the third node and the fourth node.

8. The quasi-resonant turn-off circuit of claim 1, wherein:
   the energy recovery circuit comprises:
      a first leg comprising a first switch and a third switch connected by a first node; and
      a second leg coupled in parallel with the first leg, the second leg comprising a second switch and a fourth switch connected by a second node, and
      wherein the resonant capacitor is coupled in parallel with the first leg and the second leg.

9. The quasi-resonant turn-off circuit of claim 8, further comprising:
   a first branch comprising a first auxiliary thyristor and a third auxiliary thyristor connected by a third node; and a second branch coupled in parallel with the first branch, the second branch comprising a second auxiliary thyristor and a fourth auxiliary thyristor connected by a fourth node, and wherein the energy recovery circuit is coupled in series with a parallel combination of another resonant capacitor, a voltage clamping device, and an auxiliary transistor between the third node and the fourth node.

10. The quasi-resonant turn-off circuit of claim 8, further comprising:

a parallel combination of another resonant capacitor, a voltage clamping device, and a pair of anti-series switches coupled in series with the energy recovery circuit at either the first node or the second node.

11. The quasi-resonant turn-off circuit of claim 1, wherein:

the parasitic inductances comprise at least one of a first inductance from a transformer and a second inductance from a cable coupled between the pair of anti-parallel thyristors and a load.

12. A solid-state switching apparatus, comprising:

a pair of anti-parallel thyristors configured to selectively couple a source with a load to conduct a load current; and a quasi-resonant turn-off circuit coupled in parallel with the pair of anti-parallel thyristors, wherein the quasi-resonant turn-off circuit comprises:

a resonant capacitor configured to supply a negative bias voltage to the pair of anti-parallel thyristors and commutate the load current from the pair of anti-parallel thyristors to the quasi-resonant turn-off circuit; and an energy recovery circuit configured to recharge the resonant capacitor using a decay current generated based on parasitic inductances coupled between the solid-state switching apparatus and the load after the pair of anti-parallel thyristors is off.

13. The solid-state switching apparatus of claim 12, wherein:

the energy recovery circuit comprises at least two switches that are configured to be turned on during a first time period when the resonant capacitor supplies the negative bias voltage to the pair of anti-parallel thyristors.

14. The solid-state switching apparatus of claim 13, wherein:

the at least two switches are configured to be turned off during a second time period after the first time period while the energy recovery circuit recharges the resonant capacitor.

15. The solid-state switching apparatus of claim 14, wherein:

the at least two switches comprise a first switch and a second switch, and the energy recovery circuit comprises:

a first leg comprising the first switch and a first diode connected by a first node; and a second leg coupled in parallel with the first leg, the second leg comprising the second switch and a second diode connected by a second node, and wherein the resonant capacitor is coupled in parallel with the first leg and the second leg.

16. The solid-state switching apparatus of claim 15, wherein:

the first diode and the second diode conduct the decay current during the second time period to recharge the resonant capacitor.

17. The solid-state switching apparatus of claim 12, wherein:

the parasitic inductances comprise at least one of a first inductance from a transformer and a second inductance from a cable coupled between the pair of anti-parallel thyristors and the load.

18. A solid-state switching apparatus, comprising:

a thyristor that selectively couples a source with a load to conduct a load current;

a quasi-resonant turn-off circuit coupled in parallel with the thyristor, wherein the quasi-resonant turn-off circuit comprises:

a resonant capacitor configured to supply a negative bias to the thyristor and commutate the load current away from the thyristor to the quasi-resonant turn-off circuit to interrupt the load current; and an energy recovery circuit configured to recharge the resonant capacitor using remnant energy left in parasitic inductances coupled between the solid-state switching apparatus and the load after the thyristor is off.

19. The solid-state switching apparatus of claim 18, wherein:

the energy recovery circuit comprises:

a first leg comprising a first switch and a third switch connected by a first node; and a second leg coupled in parallel with the first leg, the second leg comprising a second switch and a fourth switch connected by a second node, wherein the resonant capacitor is coupled in parallel with the first leg and the second leg, and wherein the quasi-resonant turn-off circuit further comprises:

a first branch comprising a first auxiliary thyristor and a third auxiliary thyristor connected by a third node; and a second branch coupled in parallel with the first branch, the second branch comprising a second auxiliary thyristor and a fourth auxiliary thyristor connected by a fourth node, and wherein the energy recovery circuit is coupled in series with a parallel combination of another resonant capacitor, a voltage clamping device, and an auxiliary transistor between the third node and the fourth node.

20. The solid-state switching apparatus of claim 18, wherein:

the parasitic inductances comprise at least one of a first inductance from a transformer and a second inductance from a cable coupled between the thyristor and the load.

* * * * *